US011309872B2

(12) United States Patent
Ito

(10) Patent No.: US 11,309,872 B2
(45) Date of Patent: Apr. 19, 2022

(54) OSCILLATOR APPARATUS AND OSCILLATION METHOD

(71) Applicant: SONY SEMICONDUCTOR SOLUTIONS CORPORATION, Kanagawa (JP)

(72) Inventor: Katsuhisa Ito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 392 days.

(21) Appl. No.: 16/342,058

(22) PCT Filed: Nov. 7, 2017

(86) PCT No.: PCT/JP2017/040044
§ 371 (c)(1),
(2) Date: Apr. 15, 2019

(87) PCT Pub. No.: WO2018/092633
PCT Pub. Date: May 24, 2018

(65) Prior Publication Data
US 2021/0281247 A1 Sep. 9, 2021

(30) Foreign Application Priority Data

Nov. 21, 2016 (JP) .............................. JP2016-225961

(51) Int. Cl.
*H03K 3/03* (2006.01)
*G06F 1/08* (2006.01)
*H01C 10/16* (2006.01)
(52) U.S. Cl.
CPC ............. *H03K 3/0315* (2013.01); *G06F 1/08* (2013.01); *H01C 10/16* (2013.01)

(58) Field of Classification Search
CPC .......... H03K 3/0315; G06F 1/08; H01C 10/16
(Continued)

(56) References Cited

U.S. PATENT DOCUMENTS 5,382,922 A * 1/1995 Gersbach .................. H03L 1/00
331/1 A
10,483,023 B1 * 11/2019 Itani ....................... H01C 10/16
(Continued)

FOREIGN PATENT DOCUMENTS

CN 101490960 A 7/2009
EP 2066035 A1 6/2009
(Continued)

OTHER PUBLICATIONS

International Search Report and Written Opinion of PCT Application No. PCT/JP2017/040044, dated Feb. 6, 2018, 08 pages of ISRWO.

*Primary Examiner* — Arnold M Kinkead
(74) *Attorney, Agent, or Firm* — Chip Law Group

(57) ABSTRACT

The present technology relates to an oscillation apparatus and an oscillation method allowing a variation in a frequency of a clock signal to fall within a predetermined range without using a reference clock signal. An oscillation apparatus includes an oscillation section oscillating a clock signal, an adjustment section changing a parameter of a constituent element constituting the oscillation section to thereby adjust a frequency of the clock signal, and a calibration control section controlling the adjustment section to perform frequency calibration of the oscillation section in a case in which a variation in a frequency of the clock signal oscillated by the oscillation section falls within a second range exceeding a first range permitted in an application of the clock signal.

5 Claims, 5 Drawing Sheets

(58) Field of Classification Search
USPC .................................. 331/16, 34, 175, 177 R
See application file for complete search history.

(56) References Cited

U.S. PATENT DOCUMENTS

| | | |
|---|---|---|
| 2009/0134946 A1 | 5/2009 | Onishi |
| 2010/0225406 A1 | 9/2010 | Shikata |
| 2016/0285465 A1* | 9/2016 | Abe .................... H03B 5/1278 |

FOREIGN PATENT DOCUMENTS

| | | | |
|---|---|---|---|
| JP | 2005-167927 A | 6/2005 | |
| JP | 2008-160677 A | 7/2008 | |
| JP | 2010-206650 A | 9/2010 | |
| KR | 10-2009-0026146 A | 3/2009 | |
| WO | 2008/078452 A1 | 7/2008 | |

* cited by examiner

OSCILLATOR APPARATUS AND OSCILLATION METHOD

CROSS REFERENCE TO RELATED APPLICATIONS

This application is a U.S. National Phase of International Patent Application No. PCT/JP2017/040044 filed on Nov. 7, 2017, which claims priority benefit of Japanese Patent Application No. JP 2016-225961 filed in the Japan Patent Office on Nov. 21, 2016. Each of the above-referenced applications is hereby incorporated herein by reference in its entirety.

TECHNICAL FIELD

The present technology relates to an oscillation apparatus and an oscillation method. More particularly, the present technology relates to a preferable oscillation apparatus and an oscillation method used in a case in which a variation within a predetermined range is permitted to a sampling frequency.

BACKGROUND ART

In electronic equipment that operates in synchronization with a predetermined sampling frequency, a clock signal that is generated within the electronic equipment is always synchronized with a reference clock signal supplied from the outside using a PLL circuit etc. and thereby the electronic equipment obtains an accurate sampling frequency.

In the electronic equipment described above, in a case in which a supply of the reference clock signal from the outside stops, a variation in a frequency of a clock signal that is generated within the electronic equipment becomes large, and therefore an accurate sampling frequency may not be obtained. Consequently, to suppress such a situation from occurring, there has been proposed a mechanism such that a clock signal that is generated within the electronic equipment can be synchronized with the reference clock signal supplied from the outside etc. once, and then the frequency can be stably kept (for example, refer to PTL 1).

CITATION LIST

Patent Literature

[PTL 1]
Japanese Patent Laid-open No. 2008-160677

SUMMARY

Technical Problem

According to the proposal described above, it is possible to stably keep a frequency of a clock signal that has been synchronized with the reference clock signal once. However, the reference clock signal is required at least in an initial stage.

Further, there is considered an application in which a variation in a predetermined range is permitted to a sampling frequency, such as communication equipment that receives a signal whose transmission rate is indefinite or an application in which a variation in a sampling (clock) frequency within a certain range is permitted to a predetermined transmission rate, such as a redriver IC that is disposed on the way to a transmission line of a high-speed interface as in USB 3.0 to improve signal quality. In such a case, it is sufficient if a variation in a frequency of a clock signal that is internally generated is allowed to fall within a predetermined range without using the reference clock signal. However, such a technique has not been proposed in the past.

The present technology has been made in view of such circumstances and allows a variation in a frequency of a clock signal to fall within a predetermined range without using the reference clock signal.

Solution to Problem

An oscillation apparatus according to one aspect of the present technology includes an oscillation section oscillating a clock signal, an adjustment section changing a parameter of a constituent element constituting the oscillation section to thereby adjust a frequency of the clock signal, and a calibration control section controlling the adjustment section to perform frequency calibration of the oscillation section in a case in which a variation in a frequency of the clock signal oscillated by the oscillation section falls within a second range exceeding a first range permitted in an application of the clock signal.

The adjustment section can change the parameter of the constituent element constituting the oscillation section to thereby adjust the frequency of the clock signal to the first range without using a reference clock signal.

The adjustment section can include a resistor switch, acquire an adjustment code of the resistor switch on a basis of an external reference resistor, and apply the acquired adjustment code to a resistance value of a resistor constituting the oscillation section to thereby adjust the frequency of the clock signal to the first range.

The adjustment section can include a capacitor switch, acquire an adjustment code of the capacitor switch on a basis of an external reference capacitor, and apply the acquired adjustment code to a capacitance value of a capacitor constituting the oscillation section to thereby adjust the frequency of the clock signal to the first range.

The oscillation apparatus according to one aspect of the present technology can further include a data processing section performing predetermined data processing on a basis of a clock signal after the frequency calibration in which the variation in a frequency falls within the first range.

An oscillation method according to one aspect of the present technology is an oscillation method of an oscillation apparatus including an oscillation section oscillating a clock signal, and an adjustment section changing a parameter of a constituent element constituting the oscillation section to thereby adjust a frequency of the clock signal. The oscillation method includes a calibration control step of controlling, by the oscillation apparatus, the adjustment section to perform frequency calibration of the oscillation section in a case in which a variation in a frequency of the clock signal oscillated by the oscillation section falls within a second range exceeding a first range permitted in an application of the clock signal, and a supply step of supplying, by the oscillation apparatus, the clock signal after the frequency calibration in which the variation in a frequency falls within the first range to a subsequent stage.

According to one aspect of the present technology, in a case in which a variation in a frequency of the clock signal oscillated by the oscillation section falls within a second range exceeding a first range permitted in an application of the clock signal, a parameter of a constituent element constituting the oscillation section is changed and thereby a frequency of the clock signal is adjusted.

Advantageous Effects of Invention

According to one aspect of the present technology, a variation in a frequency of a clock signal is allowed to fall within a predetermined range without using a reference clock signal.

DESCRIPTION OF EMBODIMENTS

Hereinafter, a preferred mode (hereinafter, referred to as an embodiment) for carrying out the present technology will be described in detail with reference to the accompanying drawings.

<Configuration Example of Communication Equipment According to an Embodiment>

Figure 1:
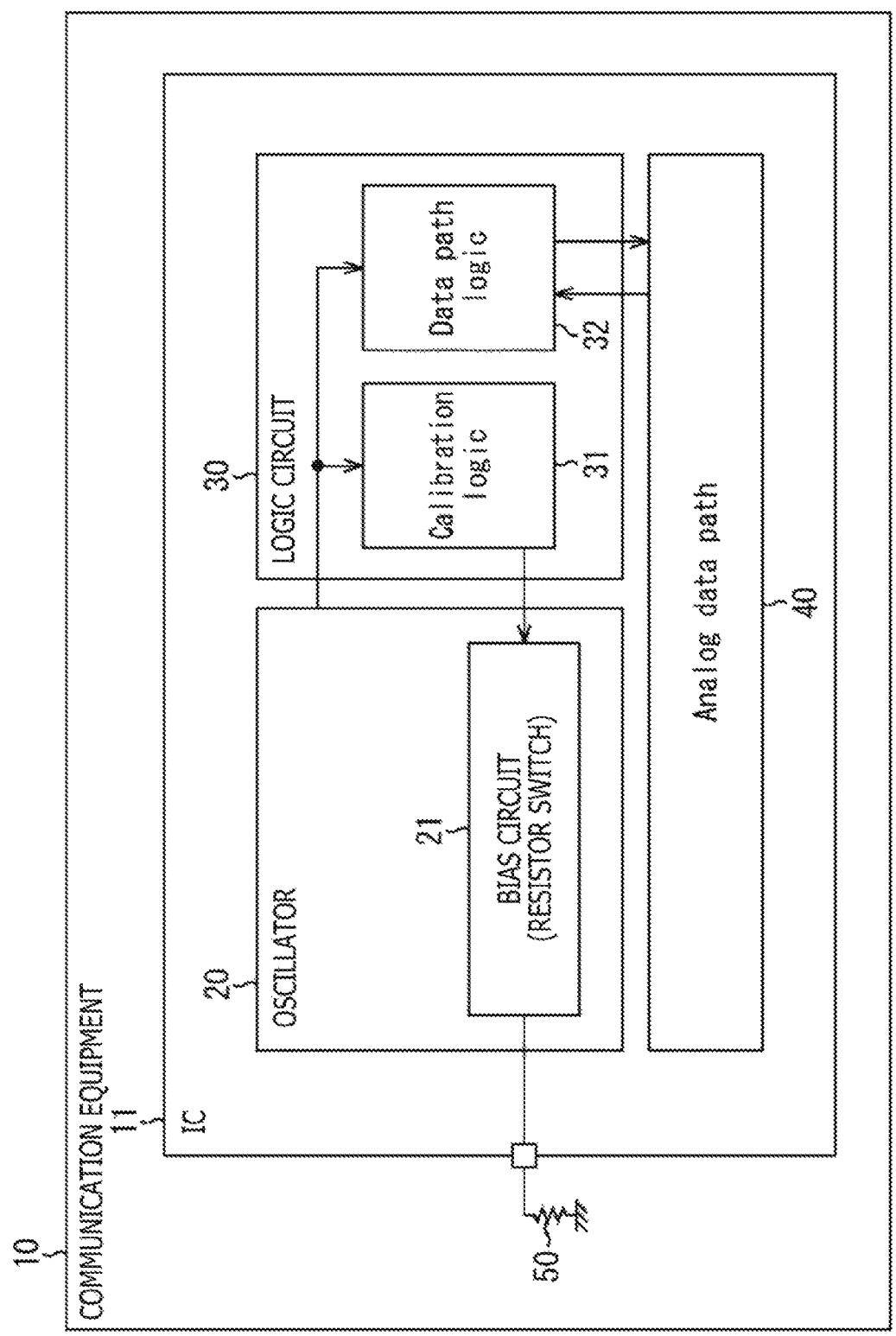
FIG. 1 is a block diagram illustrating a configuration example of communication equipment to which the present technology is applied.

FIG. 1 is a block diagram illustrating a configuration example of communication equipment according to an embodiment of the present technology.

The communication equipment 10 receives a signal whose transmission rate is indefinite, for example, and a variation in a predetermined range is permitted to a sampling frequency.

On the communication equipment 10, an IC 11 is mounted. The IC 11 is an electronic circuit in which predetermined processing is performed in accordance with the sampling frequency in which the variation in the predetermined range (for example, it is approximately ±15% of a target value. Hereinafter, it is referred to as a first range) is permitted.

The IC 11 has an oscillator 20, a logic circuit 30, and an analog data path circuit 40.

The oscillator 20 includes a ring oscillator, oscillates a clock signal in which a variation in a frequency in an initial stage falls within a second range (for example, it is approximately ±25% of the target value.) wider than the first range, and supplies the clock signal to the logic circuit 30. Further, the oscillator 20 supplies the clock signal to a subsequent stage of the clock signal in which the variation in a frequency falls within the first range using frequency calibration through a built-in bias circuit 21.

The bias circuit 21 includes a resistor switch and adjusts a frequency of the clock signal oscillated by the oscillator 20 to the first range using a resistance calibration function based on an external reference resistor 50 in which a resistance value is set with a high degree of accuracy.

The logic circuit 30 has a calibration logic circuit 31 and a data path logic circuit 32. In a case in which the variation in a frequency of the clock signal supplied from the oscillator 20 falls within the second range, the calibration logic circuit 31 controls the bias circuit 21 to perform the calibration.

After the variation in a frequency of the clock signal supplied from the oscillator 20 falls within the first range using the frequency calibration, the data path logic circuit 32 performs predetermined data processing between the data path logic circuit 32 and the analog data path circuit 40 in accordance with the clock signal.

Figure 2:
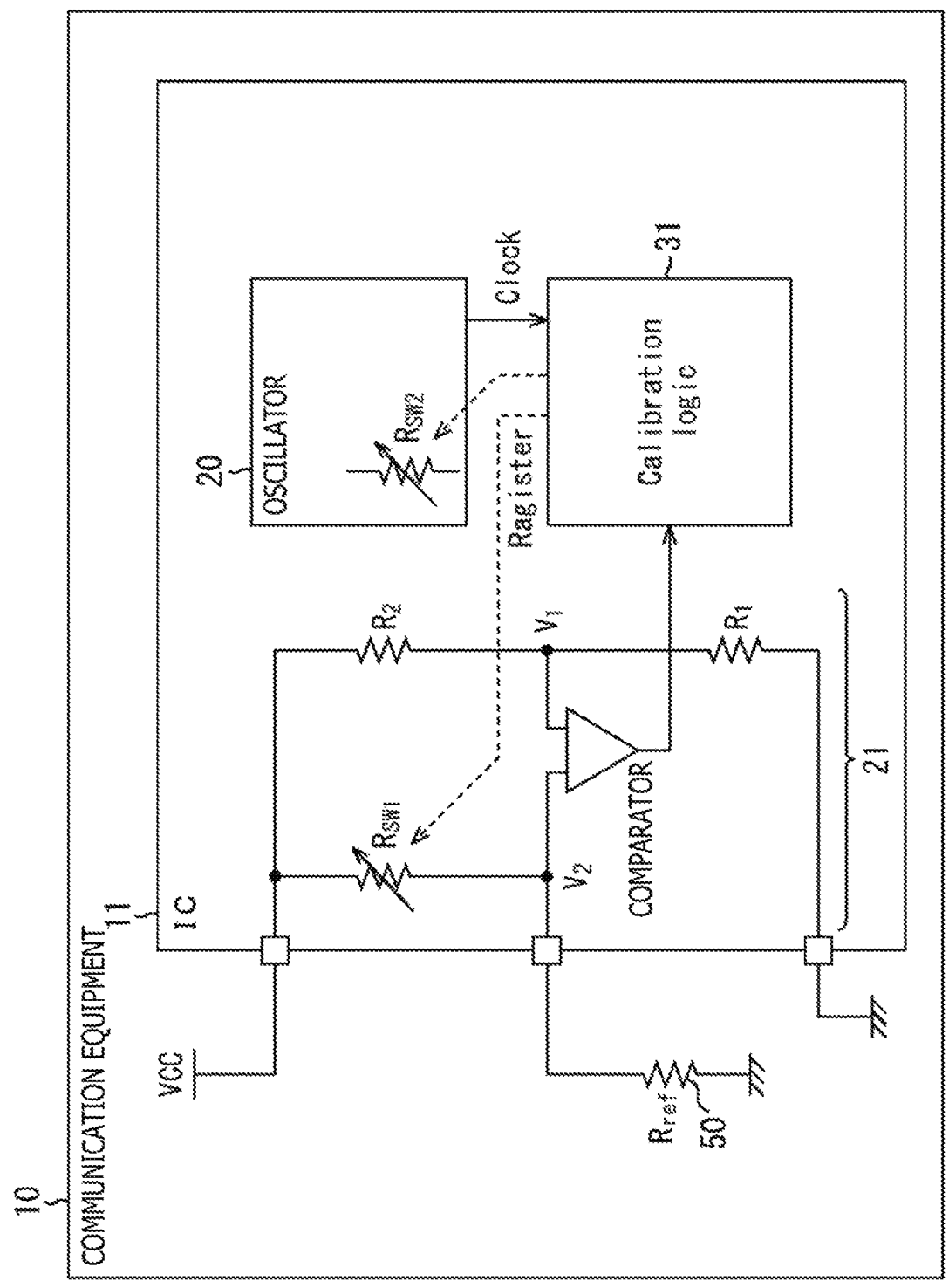
FIG. 2 is a diagram illustrating a configuration example of a bias circuit.

Then, the resistance calibration function by the bias circuit 21 will be described with reference to FIG. 2. FIG. 2 illustrates a detailed configuration example of the bias circuit 21.

Normally, there arises dispersion in an absolute value of each resistor within the IC 11. However, a layout of each resistor is devised to thereby keep a resistance ratio constant. Specifically, a resistance divided voltage $V_1$ of a power supply voltage becomes a steady value.

Therefore, in the beginning, an absolute value of a resistor switch $R_{SW1}$ is adjusted so that a voltage $V_2$ determined by a resistance ratio between the resistor switch $R_{SW1}$ and an external reference resistor $R_{ref}$ in which a resistance value is set with a high degree of accuracy is matched with the voltage $V_1$ (acquire an adjustment code). Meanwhile, a resistor switch $R_{SW2}$ within the oscillator 20 is constituted (the absolute value is changeable in serial/parallel) by the same resistor element as that of the resistor switch $R_{SW1}$ of the bias circuit 21, and then the adjustment code of the resistor switch $R_{SW1}$ is applied to a resistance value of the resistor switch $R_{SW2}$. Through the process, the variation in a frequency of the clock signal oscillated by the oscillator 20 is allowed to fall within the first range.

Figure 3:
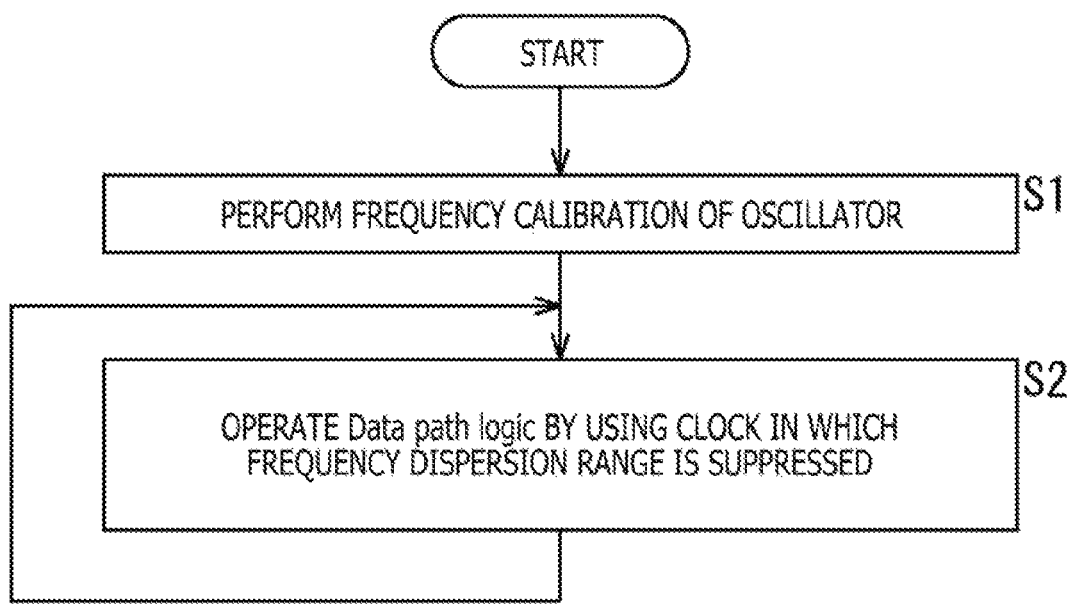
FIG. 3 is a flowchart for describing operations of the communication equipment.
Figure 4:
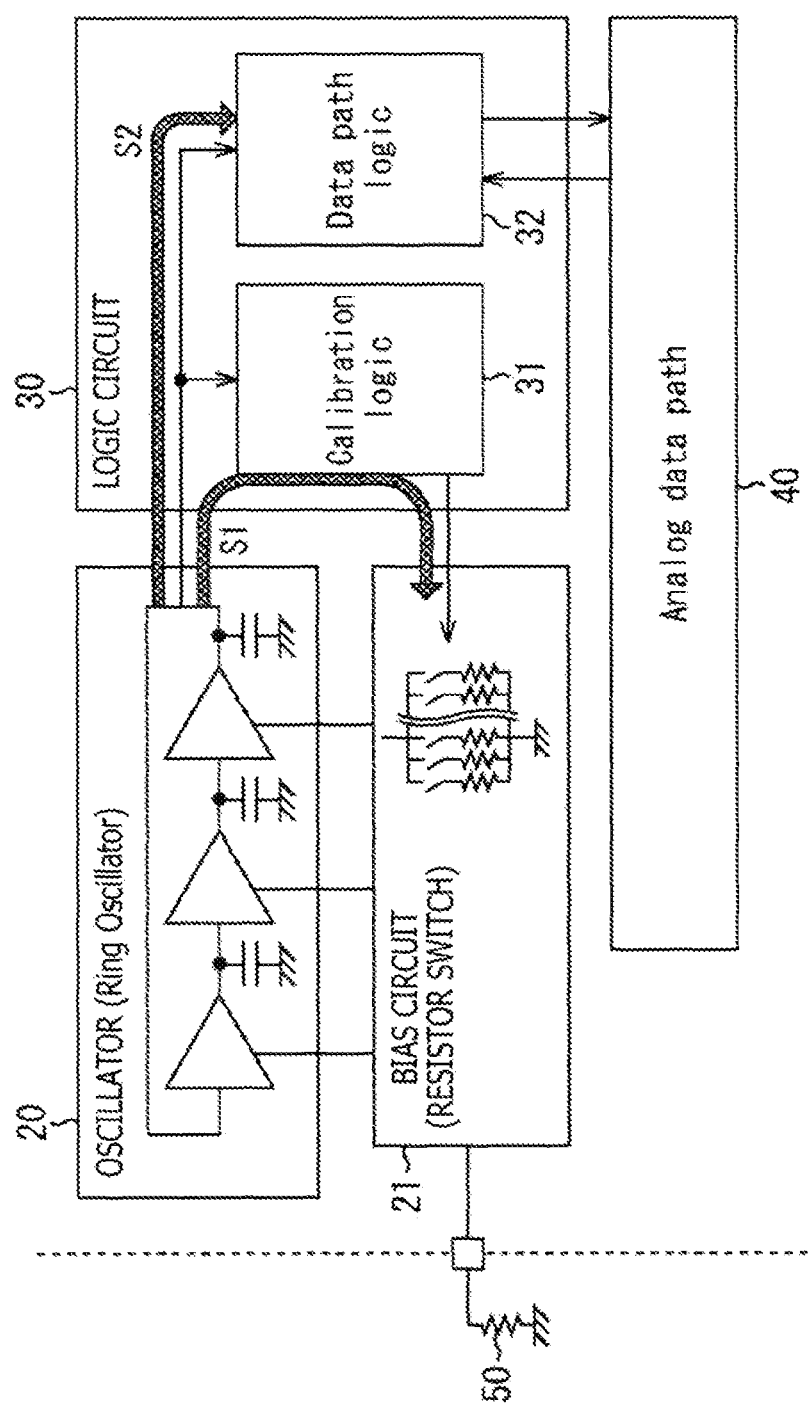
FIG. 4 is a diagram for describing frequency calibration in the communication equipment.

FIG. 3 is a flowchart for describing operations of the communication equipment 10. FIG. 4 is a diagram for describing frequency calibration processing.

In step S1 at the initial stage, when the oscillator 20 oscillates the clock signal in which the variation in a frequency falls within the second range (before the frequency calibration) and supplies the clock signal to the logic circuit 30, the calibration logic circuit 31 instructs the bias circuit 21 to perform the frequency calibration. In accordance with the instruction, the bias circuit 21 acquires the above-described adjustment code and applies the adjustment code of the resistor switch $R_{SW1}$ to the resistance value of the resistor switch $R_{SW2}$ within the oscillator 20. Through the process, the variation in a frequency of the clock signal oscillated by the oscillator 20 is immediately allowed to fall within the first range.

Then, in step S2, the data path logic circuit 32 performs the predetermined processing between the data path logic circuit 32 and the analog data path circuit 40 in accordance with the clock signal in which the variation in a frequency supplied from the oscillator 20 falls within the first range. This is the end of operation descriptions of the communication equipment 10.

According to the operations of the communication equipment 10 described above, a variation range in a frequency of the clock signal that is oscillated from the oscillator 20 at the initial stage is the second range. However, the frequency calibration is immediately performed and the variation range in a frequency of the clock signal that is oscillated from the oscillator 20 is adjusted to the first range. Accordingly, in the communication equipment 10, the predetermined processing can be performed.

<Another Configuration Example of the Communication Equipment According to the Embodiment>

Figure 5:
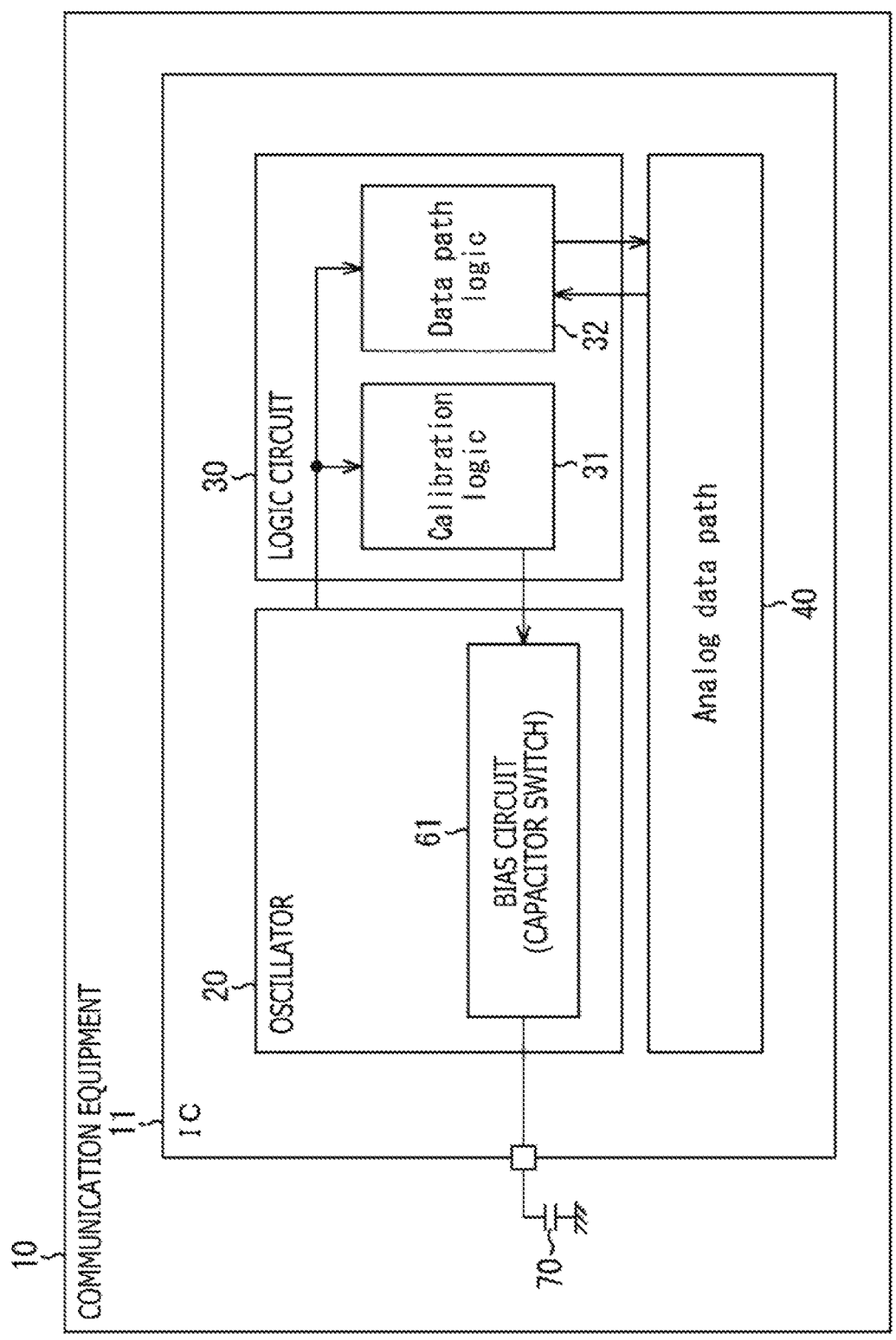
FIG. 5 is a block diagram illustrating another configuration example of the communication equipment to which the present technology is applied.

FIG. 5 is a block diagram illustrating another configuration example of the communication equipment according to the embodiment of the present technology.

In the another configuration example, the bias circuit 21 including the resistor switch in the configuration example illustrated in FIG. 1 is replaced with a bias circuit 61 including a capacitor switch. In this case, an external reference capacitor 70 in which a capacitance value is set with a high degree of accuracy is connected to the bias circuit 61. Constituent devices other than the bias circuit 61 are similar to those illustrated in FIG. 1, and therefore descriptions are omitted.

The bias circuit 21 acquires the adjustment code that is set to the resistor switch $R_{SW2}$ within the oscillator 20 through the frequency calibration in the configuration example illustrated in FIG. 1. Similarly to the above, it is sufficient if the bias circuit 61 acquires an adjustment code that is set to the capacitor switch within the oscillator 20 through frequency calibration in the another configuration example.

Note that, in the frequency calibration, other parameters that exert an influence on an oscillation frequency within the oscillator 20 may be changed in addition to a change of resistance values or capacitance values within the oscillator 20.

As described above, according to the communication equipment according to the embodiment of the present technology, the variation in a frequency of the clock signal oscillated within the communication equipment is allowed to fall within the first range without using a reference clock signal. Accordingly, the communication equipment can be used for an application such as reception of a signal whose transmission rate is indefinite, for example.

<Modifications>

In the above-described configuration example, a ring oscillator is used as the oscillator 20. Further, a device including an LC circuit having L (inductance) and C (capacitance) may be used as the oscillator 20. In the case, L or C is adjusted to thereby obtain effects described above.

In addition to the communication equipment according to the embodiment of the present technology, the present technology is applicable to an application in which a variation in a sampling (clock) frequency within a certain range is permitted to a predetermined transmission rate, such as a redriver IC that is disposed on the way to a transmission line of a high-speed interface as in USB 3.0 to improve signal quality.

In addition, the embodiment of the present technology is not limited to the above-described embodiment and can be variously modified without departing from the scope of the present technology.

Note that the present technology can also take the following configurations.

(1)
An oscillation apparatus including:
an oscillation section oscillating a clock signal;
an adjustment section changing a parameter of a constituent element constituting the oscillation section to thereby adjust a frequency of the clock signal; and
a calibration control section controlling the adjustment section to perform frequency calibration of the oscillation section in a case in which a variation in a frequency of the clock signal oscillated by the oscillation section falls within a second range exceeding a first range permitted in an application of the clock signal.

(2)
The oscillation apparatus according to (1), in which the adjustment section changes the parameter of the constituent element constituting the oscillation section to thereby adjust the frequency of the clock signal to the first range without using a reference clock signal.

(3)
The oscillation apparatus according to (1) or (2), in which the adjustment section includes a resistor switch, acquires an adjustment code of the resistor switch on a basis of an external reference resistor, and applies the acquired adjustment code to a resistance value of a resistor constituting the oscillation section to thereby adjust the frequency of the clock signal to the first range.

(4)
The oscillation apparatus according to (1) or (2), in which the adjustment section includes a capacitor switch, acquires an adjustment code of the capacitor switch on a basis of an external reference capacitor, and applies the acquired adjustment code to a capacitance value of a capacitor constituting the oscillation section to thereby adjust the frequency of the clock signal to the first range.

(5)
The oscillation apparatus according to any one of (1) to (4), further including:
a data processing section performing predetermined data processing on a basis of a clock signal after the frequency calibration in which the variation in a frequency falls within the first range.

(6)
An oscillation method of an oscillation apparatus including:
an oscillation section oscillating a clock signal; and
an adjustment section changing a parameter of a constituent element constituting the oscillation section to thereby adjust a frequency of the clock signal, the oscillation method including:
a calibration control step of controlling, by the oscillation apparatus, the adjustment section to perform frequency calibration of the oscillation section in a case in which a variation in a frequency of the clock signal oscillated by the oscillation section falls within a second range exceeding a first range permitted in an application of the clock signal; and
a supply step of supplying, by the oscillation apparatus, the clock signal after the frequency calibration in which the variation in a frequency falls within the first range to a subsequent stage.

REFERENCE SIGNS LIST

10 Communication equipment
11 IC
20 Oscillator
21 Bias circuit
30 Logic circuit
31 Calibration logic circuit
32 Data path logic circuit
40 Analog data path circuit
50 External reference resistor
61 Bias circuit
70 External reference capacitor

The invention claimed is:
1. An oscillation apparatus, comprising:
an oscillation section comprising a resistor, wherein the oscillation section is configured to oscillate a clock signal;

an adjustment section comprising a resistor switch, wherein the adjustment section is configured to:
acquire an adjustment code of the resistor switch based on an external reference resistor;
apply the acquired adjustment code to a resistance value of the resistor that constitutes the oscillation section;
change a parameter of the resistor that constitutes the oscillation section based on the applied adjustment code; and
adjust a frequency of the clock signal to a first range based on the changed parameter, wherein the first range is permitted in an application of the clock signal; and
a calibration control section configured to control the adjustment section to perform frequency calibration of the oscillation section, wherein the frequency calibration of the oscillation section is performed based on a variation in the frequency of the clock signal oscillated by the oscillation section that falls within a second range exceeding the first range permitted in the application of the clock signal.

2. The oscillation apparatus according to claim 1, wherein the adjustment section is further configured to adjust the frequency of the clock signal to the first range without using a reference clock signal.

3. The oscillation apparatus according to claim 1, further comprising:
a data processing section configured to perform data processing based on the clock signal obtained based on the frequency calibration in which the variation in the frequency falls within the first range.

4. An oscillation method of an oscillation apparatus, the oscillation method comprising:
acquiring an adjustment code of a resistor switch of an adjustment section of the oscillation apparatus based on an external reference resistor;
applying the acquired adjustment code to a resistance value of a resistor that constitutes an oscillation section of the oscillation apparatus, wherein the oscillation section is configured to oscillate a clock signal;
changing a parameter of the resistor that constitutes the oscillation section based on the applied adjustment code;

adjusting a frequency of the clock signal to a first range based on the changed parameter, wherein the first range is permitted in an application of the clock signal;
controlling the adjustment section of the oscillation apparatus to perform frequency calibration of the oscillation section, wherein the frequency calibration of the oscillation section is performed based on a variation in the frequency of the clock signal oscillated by the oscillation section that falls within a second range exceeding the first range permitted in the application of the clock signal; and
supplying the clock signal to a subsequent stage after the frequency calibration in which the variation in the frequency falls within the first range.

5. An oscillation apparatus, comprising:
an oscillation section comprising a capacitor, wherein the oscillation section is configured to oscillate a clock signal;
an adjustment section comprising a capacitor switch, wherein the adjustment section is configured to:
acquire an adjustment code of the capacitor switch based on an external reference capacitor;
apply the acquired adjustment code to a capacitance value of the capacitor that constitutes the oscillation section;
change a parameter of the capacitor that constitutes the oscillation section based on the applied adjustment code; and
adjust a frequency of the clock signal to a first range based on the changed parameter, wherein the first range is permitted in an application of the clock signal; and
a calibration control section configured to control the adjustment section to perform frequency calibration of the oscillation section, wherein the frequency calibration of the oscillation section is performed based on a variation in the frequency of the clock signal oscillated by the oscillation section that falls within a second range exceeding the first range permitted in the application of the clock signal.

* * * * *